United States Patent [19]

Koyama

[11] Patent Number: 5,581,124
[45] Date of Patent: Dec. 3, 1996

[54] SEMICONDUCTOR DEVICE HAVING WIRING AND CONTACT STRUCTURE

[75] Inventor: Kuniaki Koyama, Tokyo, Japan

[73] Assignee: NEC Corporation, Japan

[21] Appl. No.: 511,301

[22] Filed: Aug. 4, 1995

[30] Foreign Application Priority Data

Aug. 4, 1994 [JP] Japan .................................. 6-202843

[51] Int. Cl.⁶ ............................ H01L 23/50; H01L 21/90
[52] U.S. Cl. .................... 257/758; 257/296; 257/774; 257/508; 257/313; 257/306
[58] Field of Search ..................... 257/758, 296, 257/324, 508, 516, 520, 532, 535, 774, 295, 298, 300–304, 306–308, 312, 313, 776

[56] References Cited

U.S. PATENT DOCUMENTS

| 4,754,313 | 6/1988 | Takemae et al. | 257/306 |
| 5,172,202 | 12/1992 | Kazuo | 257/758 |

FOREIGN PATENT DOCUMENTS

| 63-299142 | 12/1988 | Japan . | |
| 5-55466 | 3/1993 | Japan | 257/298 |
| 5-251657 | 9/1993 | Japan | 257/306 |

Primary Examiner—Sara W. Crane
Assistant Examiner—Alexander Oscar Williams
Attorney, Agent, or Firm—Hayes, Soloway, Hennessey, Grossman & Hage, P.C.

[57] ABSTRACT

In a wiring and contact structure of a semiconductor device, a contact hole is formed to pass trough an interlayer insulating film and a gate oxide film and the contact hole is filled with a conductive material layer which projects from the interlayer insulating film. A first wiring layer is formed on the conductive material layer so as to partially overlap the contact hole, and an first insulating film is formed between the conductive material layer and the first wiring layer. A second insulating film having the same pattern as that of the first wiring layer is formed on the first wiring layer, and a third insulating film is formed as a side wall covering a side surface of the first wiring layer. A second wiring layer is formed on the conductive material layer and the first wiring layer in such a manner that the second wiring layer is in contact with the conductive material layer and partially overlaps the first wiring layer but is electrically insulated from the first wiring layer by the second and third insulating films.

2 Claims, 18 Drawing Sheets

5,581,124

SEMICONDUCTOR DEVICE HAVING WIRING AND CONTACT STRUCTURE

BACKGROUND OF THE INVENTION

1. Field of the Invention

The present invention relates to a semiconductor device and a method for manufacturing the same, and more specifically to a semiconductor device having a fine wiring and contact structure, and a method for manufacturing the same.

2. Description of Related Art

With recent increases in integration density of semiconductor devices, the diameter of contact holes has become small, and the width and the spacing of wiring conductor layers electrically connected to the contacts have correspondingly become small. Therefore, in order to realize microminiaturization in the semiconductor device, it has become important that wiring/contact hole margin be made small and that contact resistance be made small in a small contact diameter.

Referring to FIG. 1D, there is shown a conventional wiring and contact structure. A conventional method for forming the conventional wiring and contact structure will be described with reference to FIGS. 1A to 1D illustrating a process of the conventional method.

Firstly, as shown in FIG. 1A, a field oxide film 2 is formed on a p-type silicon substrate 1 by means of a conventional LOCOS (local oxidation of silicon) process, and after a gate oxide film 3 is formed on the substrate, an n-type diffused layer 4 is formed by ion-implanting for example arsenic.

Thereafter, as shown in FIG. 1B, a silicon oxide film is deposited by for example a CVD (chemical vapor deposition) process so as to form a first interlayer insulating film 5A covering the field oxide film 2 and the gate oxide film 3, and then, for example, a tungsten silicide is deposited as a first wiring layer forming material. Thereafter, a photoresist 12 having a predetermined pattern is formed, and an etching is performed using the photoresist 12 as a mask, so as to form a first wiring layer 10. The photoresist 12 is removed.

Then, as shown in FIG. 1C, a silicon oxide film is deposited by for example the CVD process so as to form a second interlayer insulating film 18 covering the first wiring layer 10, the field oxide film 2 and the gate oxide film 3. Then, a photoresist 7 having a predetermined pattern is formed, and the second and first interlayer insulating films 18 and 5A are selectively etched using the photoresist 7 as a mask, so as to form a contact hole, 5B on the n-type diffused layer 4.

Thereafter, as shown in FIG. 1D, a polysilicon film is deposited as a second wiring layer forming material filling the contact hole and covering the second interlayer insulating film 18. Then, a photoresist 19 having a predetermined pattern is formed, and the polysilicon film is etched using the photoresist 19 as a mask, so as to form a second wiring layer 14 electrically connected through the contact hole 5B on the n-type diffused layer 4.

In addition, there have been proposed various improved wiring and contact structures capable of making the integration density higher than that of the conventional multilayer wiring structure as mentioned just above. Japanese Patent Application Laid-open Publication No. JP-A-63-299142 shows one example of the improved wiring and contact structures. Referring to FIG. 2E, there is shown a sectional view of the improved wiring and contact structure proposed by JP-A-63-299142. FIGS. 2A to 2E are sectional views illustrating the process for manufacturing the improved wiring and contact structure.

In this process, as shown in FIG. 2A, a field oxide film 2 is formed on a p-type silicon substrate 1 by means of a conventional LOCOS process, and then, a gate oxide film 3 is formed on the substrate. Furthermore, an n-type diffused layer 4 is formed by ion-implanting for example arsenic.

Thereafter, a silicon oxide film is deposited by for example a CVD process so as to form a first interlayer insulating film 5A covering the field oxide film 2 and the gate oxide film 3, and then, for example, a tungsten silicide is deposited as a first wiring layer forming material. Furthermore, a photoresist 12 having a predetermined pattern is formed, and the silicide is patterned using the photoresist 12 as a mask, so as to form a first wiring layer 10. The photoresist 12 is removed.

Then, as shown in FIG. 2B, a silicon oxide film is deposited by for example the CVD process so as to form a second interlayer insulating film 18 covering the first wiring layer 10, the field oxide film 2 and the gate oxide film 3. Then, a photoresist 7 having a predetermined pattern is formed, and the second interlayer insulating film 18, the first wiring layer 10, the first interlayer insulating film 5A and the gate oxide film 3 are selectively etched using the photoresist 7 as a mask, so as to form a contact hole 5B which causes a surface of the n-type diffused layer 4 to be exposed.

Thereafter, as shown in FIG. 2C, a silicon oxide film is deposited by for example the CVD process so as to form an insulating film 20, and an anisotropic etching is formed to cause the insulating film 20 to remain only on a side surface of the contact hole 5B, as shown in FIG. 2D.

Then, as shown in FIG. 2E, a polysilicon film is deposited as a second wiring layer forming material filling the contact hole and covering the second insulating film 18, and then, a photoresist 19 having a predetermined pattern is formed. Furthermore, the polysilicon film is etched using the photoresist 19 as a mask, so as to form a second wiring layer 14 electrically connected through the contact hole 5B on the n-type diffused layer 4 but electrically insulated from the first wiring layer 10.

Furthermore, there has been known to the inventor a structure as shown in FIG. 3, in which a conductor layer 8 connected through a contact hole to an n-type diffused layer 4 is used as a pad for connecting to a second wiring layer 14, so that the contact can overlap a first wiring layer 10. In this connection structure, the first wiring layer 10 is formed on the conductor layer 8 with a second interlayer insulating film 18 being interposed between the conductor layer 8 and the first wiring layer 10, and the second wiring layer 14 is formed on the first wiring layer 10 with a third interlayer insulating film 21 being interposed between the first wiring layer 10 and the second wiring layer 14.

However, the above mentioned conventional connection structures and the conventional methods for manufacturing the same have the following disadvantages:

In the structure shown in FIG. 1D, since an alignment margin is required to prevent a short-circuit between the contact and the first wiring layer, it has been difficult to microminiaturize.

In the structure shown in FIG. 2E, on the other hand, since the insulation between the first wiring layer and the contact is realized by the insulating film which is deposited on the side surface of the contact hole in a self-alignment manner, the margin for alignment between the wiring conductor and the contact hole is no longer required. However, the width of the first wiring layer must be larger than the size of the contact hole, since the first wiring layer would be otherwise open-circuited. Therefore, microminiaturization is very difficult. In addition, since the first wiring layer is made thin at the contact portion, the wiring resistance inevitably increases. In addition, since the size of the contact is reduced by the insulating film deposited on the side surface of the contact hole, and since the contact hole is formed deeply, the contact resistance inevitably increases.

In the conventional example shown in FIG. 3, the photoresist process for forming the pad must be newly added, and since there is required an alignment margin between the first wiring layer 10 and the contact hole connecting the second wiring layer 14 to the pad, it is not a satisfactory structure for realizing.

SUMMARY OF THE INVENTION

Accordingly, it is an object of the present invention to provide a wiring and contact structure of a semiconductor device, which overcome the above mentioned defects of the conventional ones.

Another object of the present invention is to provide a wiring and contact structure having a reduced contact resistance and capable of realizing microminiaturization, and a method for forming the wiring and contact structure without an additional photoresist mask process.

The above and other objects of the present invention are achieved in accordance with the present invention by a semiconductor device comprising a semiconductor substrate, a conducting layer formed in the semiconductor substrate, an interlayer insulating layer formed above the conducting layer, a contact hole formed in the interlayer insulating layer to expose a surface of the conducting layer, a conductive material layer filled in the contact hole, a first wiring layer formed to have a part overlapping a part of the conductive material layer, a first insulating film formed between the conductive material layer and the first wiring layer, a second insulating film formed on an upper surface of the first wiring layer having the same pattern as that of the first wiring layer, a side wall insulating film formed on a side surface of the first wiring layer, and a second wiring layer formed in contact with the conductive material layer but insulated from the first wiring layer by the second insulating film and the side wall insulating film.

According to another aspect of the present invention, there is provided a method for manufacturing a semiconductor device, comprising:

the step of depositing an interlayer insulating film on a semiconductor substrate;

the step of selectively etching the interlayer insulating film so as to form a contact hole in which a surface of an underlying conducting layer is exposed;

the step of forming a conductive material layer filling the contact hole;

the step of forming a first insulating film covering an exposed surface of the conductive material layer;

the step of depositing a first wiring, material layer and a second insulating film in the named order, and patterning a stacked layer of the first wiring material layer and the second insulating film, so as to form a first wiring layer which has its part overlapping a part of the conductive material layer and which has its upper surface covered with the second insulating film;

the step of depositing a third insulating film on a whole surface and etching back the deposited third insulating film so as to form a side wall insulating film covering a side surface of the first wiring layer;

the step of removing an exposed portion of the first insulating film; and the step of depositing a second wiring maternal layer and patterning the deposited second wiring material layer to form a second wiring layer which is in contact with the first conductive material layer and which is insulated from the first wiring layer by the second insulating layer and the side wall insulating film.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
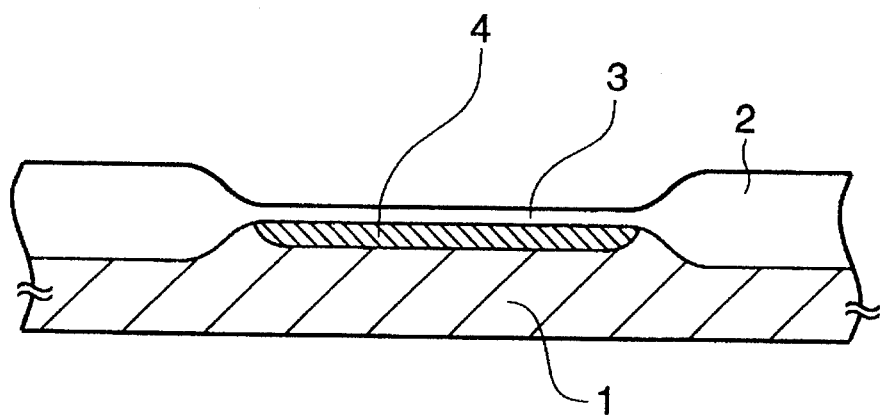
FIG. 1A to 1D are diagrammatic sectional views illustrating a first example of a wiring and contact forming process in the prior art.
Figure 1B:
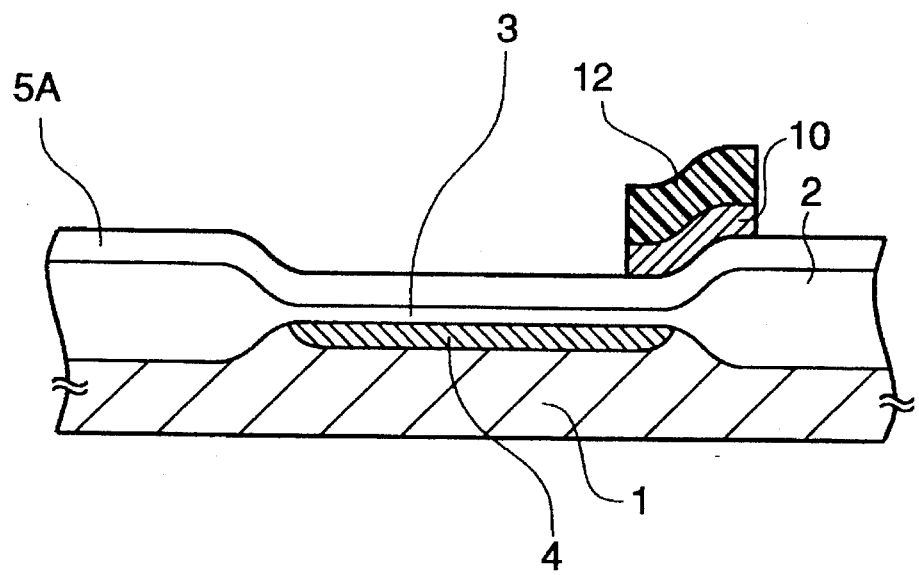
Figure 1C:
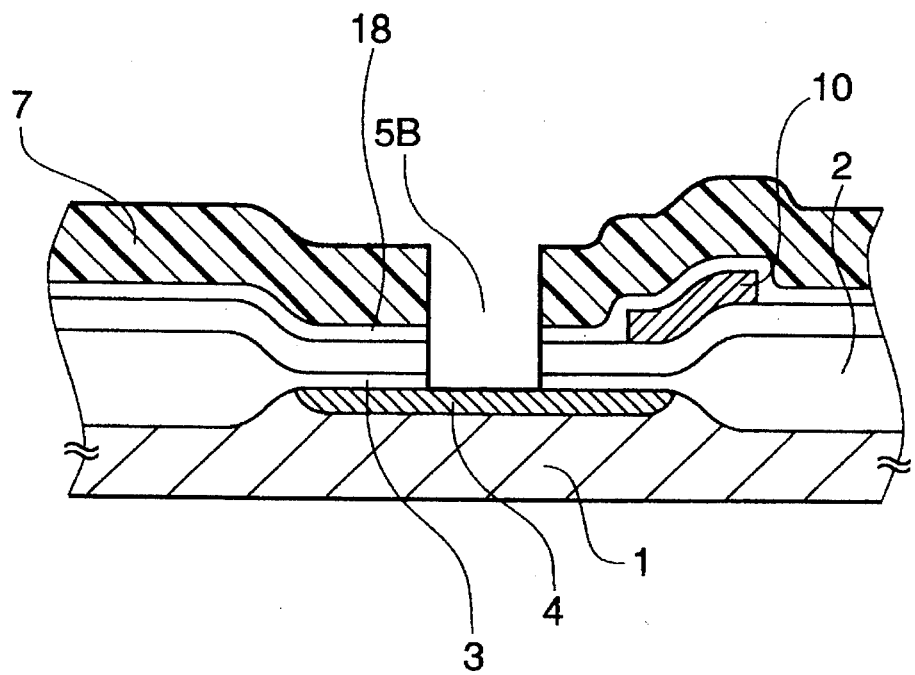
Figure 1D:
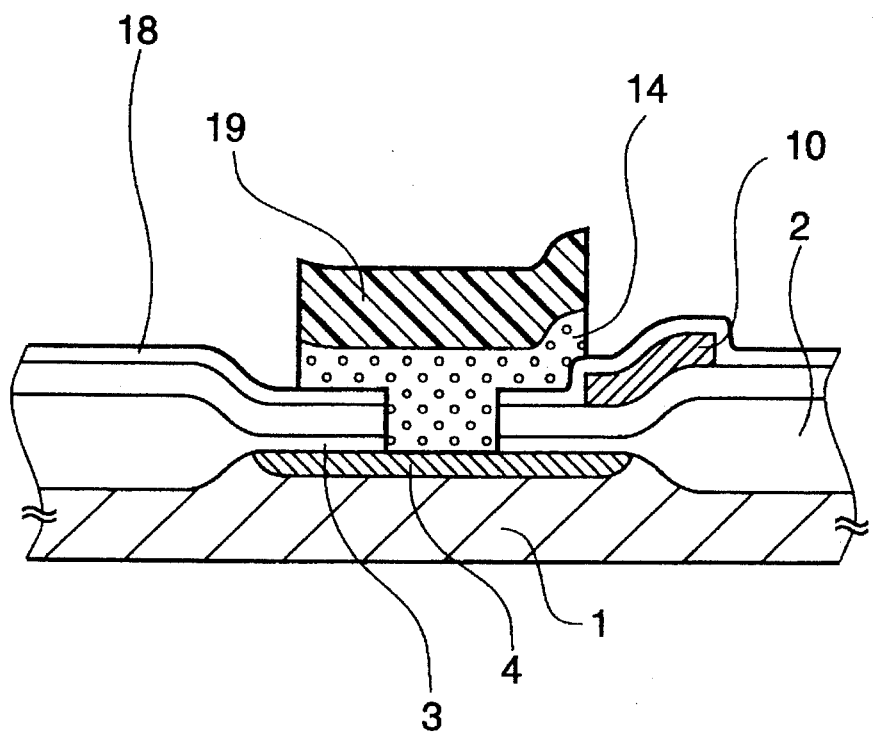
Figure 2A:
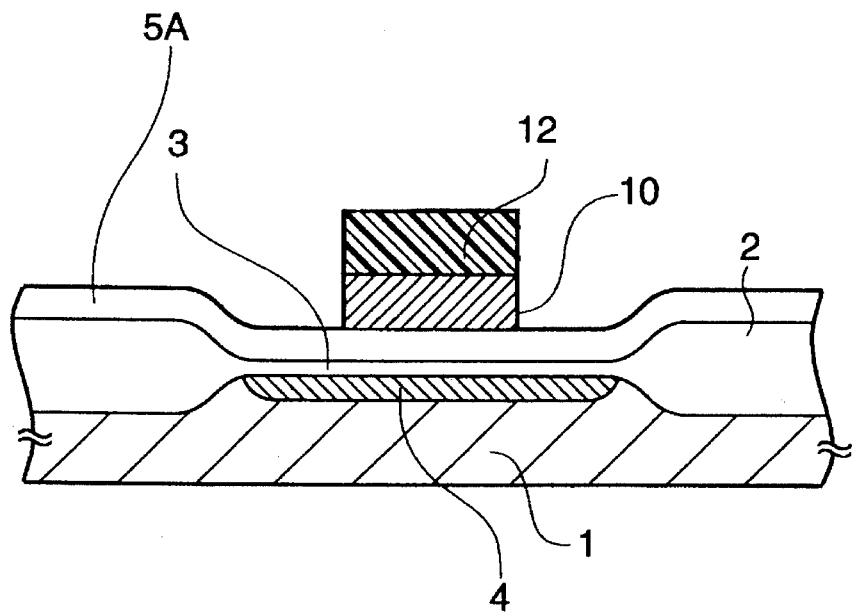
FIG. 2A to 2E are diagrammatic sectional views illustrating a second example of a wiring and contact forming process in the prior art.
Figure 2B:
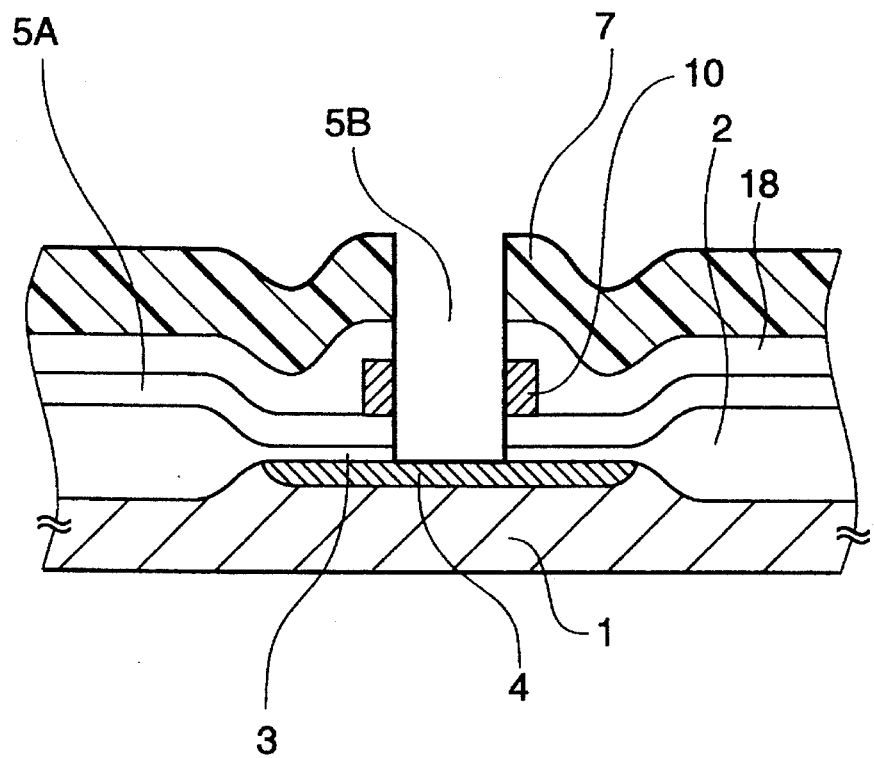
Figure 2C:
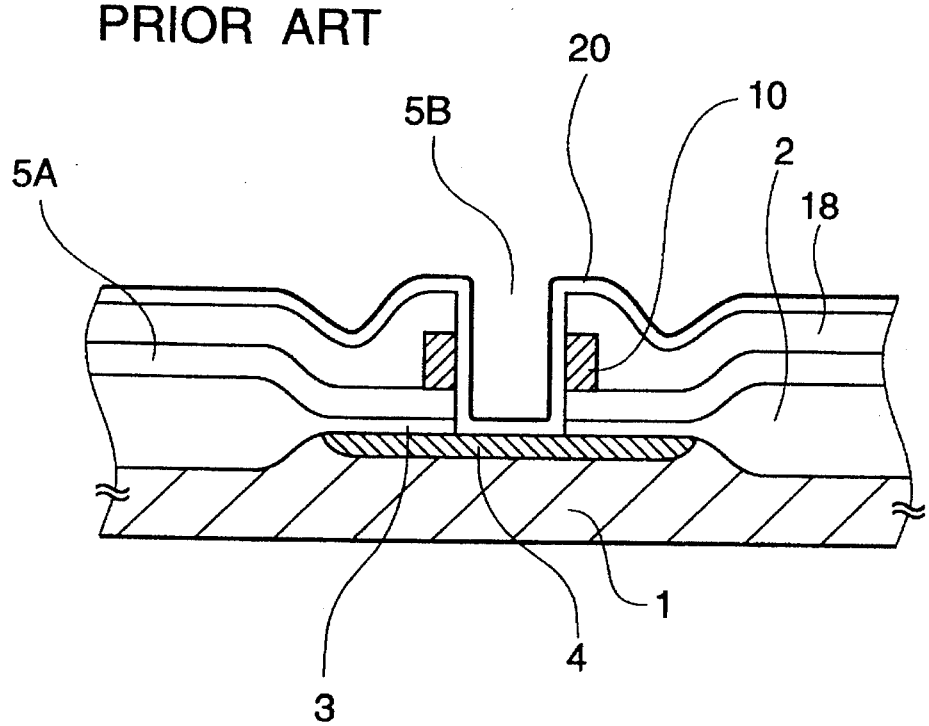
Figure 2D:
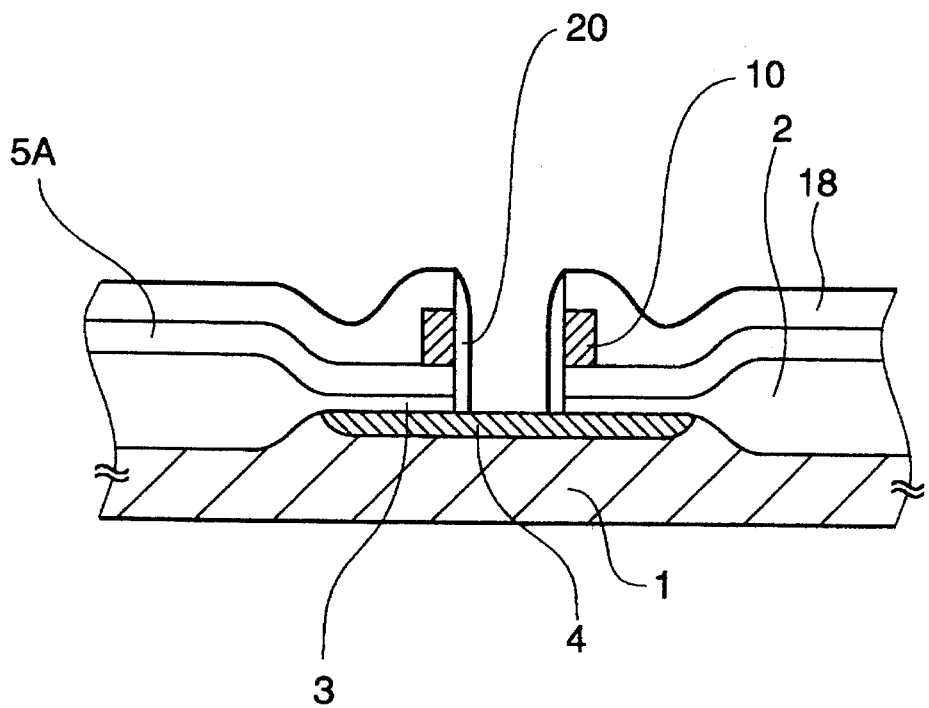
Figure 2E:
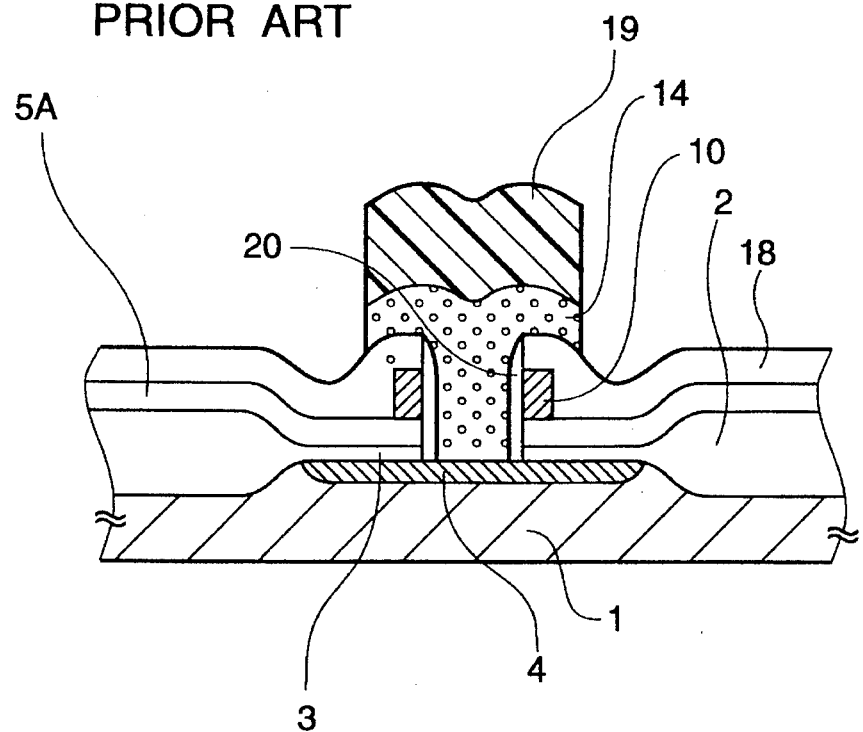
Figure 3:
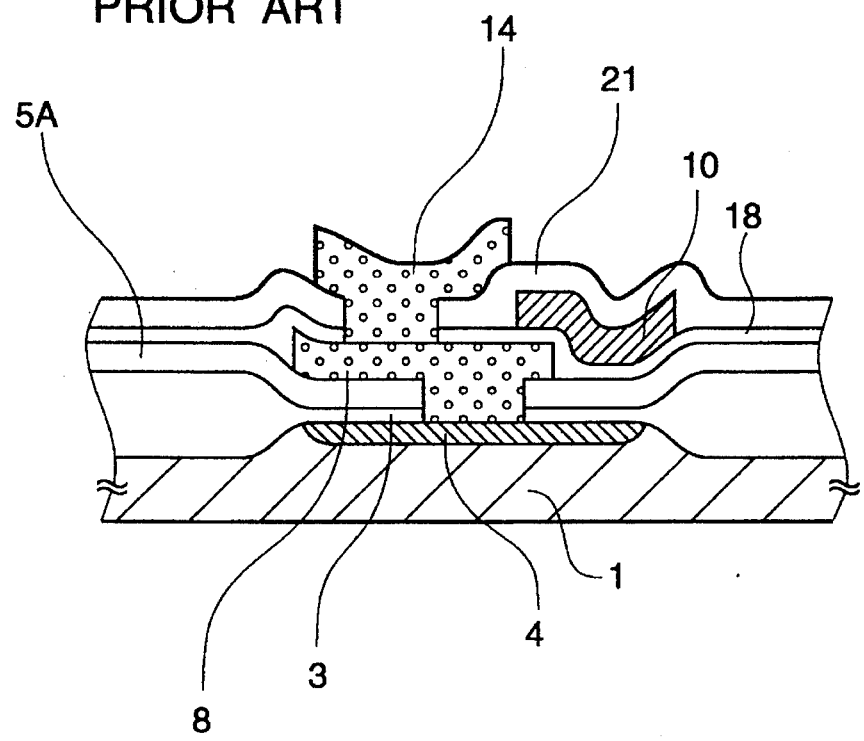
FIG. 3 is a diagrammatic sectional view illustrating a third example of a wiring and contact structure in the prior art.
Figure 4:
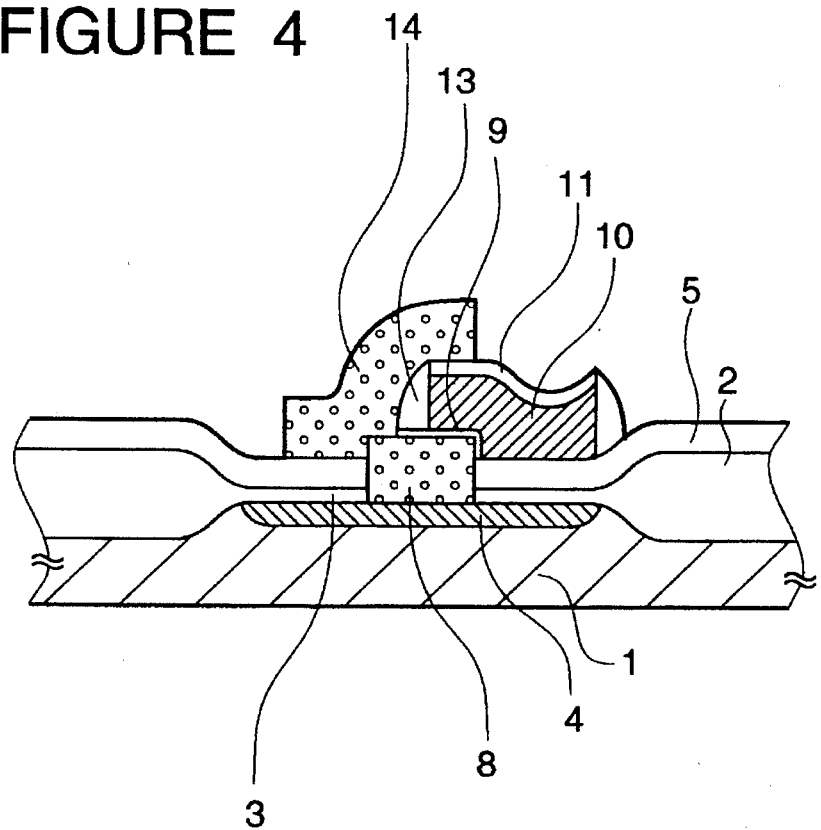
FIG. 4 is a diagrammatic sectional view illustrating a first embodiment of the wiring and contact structure in accordance with the present invention.

Referring to FIG. 4, them is shown a diagrammatic sectional view illustrating a first embodiment of the wiring and contact structure in accordance with the present invention.

The first embodiment includes a p-type silicon substrate 1 having an n-type diffused layer 4 formed in a surface region defined by a field oxide film 2 also formed on the substrate 1. A contact hole is formed to pass through an gate oxide film 3 and an interlayer insulating film 5 which are formed on the n-type diffused layer 4 in the named order. The contact hole is filled with a conductive material layer 8, which projects upward from an upper surface of the interlayer insulating film 5.

On the conductive material layer 8, there is formed a first wiring layer 10 having its pan covering a pan of the conductive material layer 8 through a first insulating layer 9. An an upper surface of the first wiring layer 10 is covered with a second insulating layer 11 having the same pattern as that of the first wiring layer 10, and a side surface of the first wiring layer 10 is covered with a third insulating film 13 formed as a side wall. On the conductive material layer 8 and the first wiring layer 10, there is formed a second wiring layer 14 which is in contact with the conductive material layer 8 but which is insulated from the first wiring layer 10 by the second insulating layer 11 and the third insulating film 13.

With the above mentioned structure, (1) it is possible to form the first wiring layer in such a manner that a part of the first wiring layer overlaps the contact portion, and (2) it is no longer necessary to consider an alignment margin between the contact hole and the first wiring layer and an alignment margin between the first wiring layer and the second wiring layer. Therefore, it is possible to further microminiaturize the connection structure in comparison with the prior art structures mentioned hereinbefore. In addition, since the second wiring layer is in contact with not only the upper surface but also the side surface of the conductive material layer, the contact resistance can be maintained small Now, a process for forming the first embodiment of the wiring and contact structure will be described with FIGS. 5A to 5J.

On a p-type silicon substrate 1, a field oxide film 2 having a thickness of about 4000 Å is formed by means of a conventional LOCOS process, and then, a gate oxide film 3 having a thickness of about 150 Å is formed by a thermal oxidation. Furthermore, an n-type diffused layer 4 is formed by ion-implanting for example arsenic under an energy of 50 KeV and a concentration of $1.0 \times 10^{15}$ cm$^{-2}$.

Figure 5A:
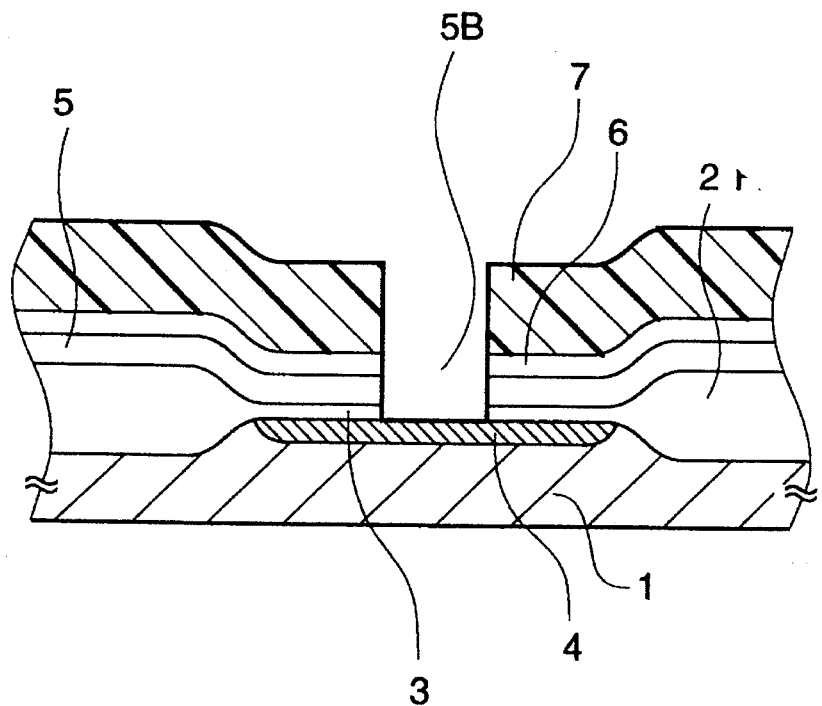
FIG. 5A to 5I are diagrammatic sectional views illustrating a process for forming the wiring and contact structure shown in FIG. 4.

Thereafter, a silicon oxide film having a thickness of about 3000 Å is deposited by for example a CVD process so as to form an interlayer insulating film 5, and then, a silicon nitride film having a thickness of about 2000 Å, having a film property different from that of the interlayer insulating film 5, is deposited by for example a CVD process so as to form a spacer layer 6. A photoresist 7 having a predetermined pattern is formed, and the spacer layer 6, the interlayer insulating film 5 and the gate oxide film 3 are selectively etched using the photoresist 7 as a mask, so as to form a contact hole 5B in which a surface of the n-type diffused layer 4 is exposed, as shown in FIG. 5A.

Figure 5B:
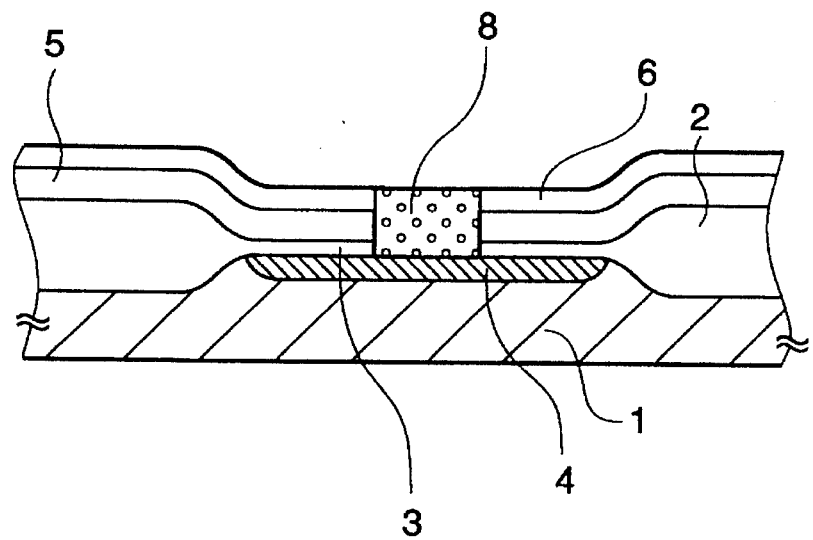

Thereafter, as shown in FIG. 5B, a polysilicon film having a thickness of about 3000 Å, is grown, and the grown polysilicon film is etched back by an anisotropic etching so as to form a conductive material layer 8 filling the contact hole 5B.

Figure 5C:
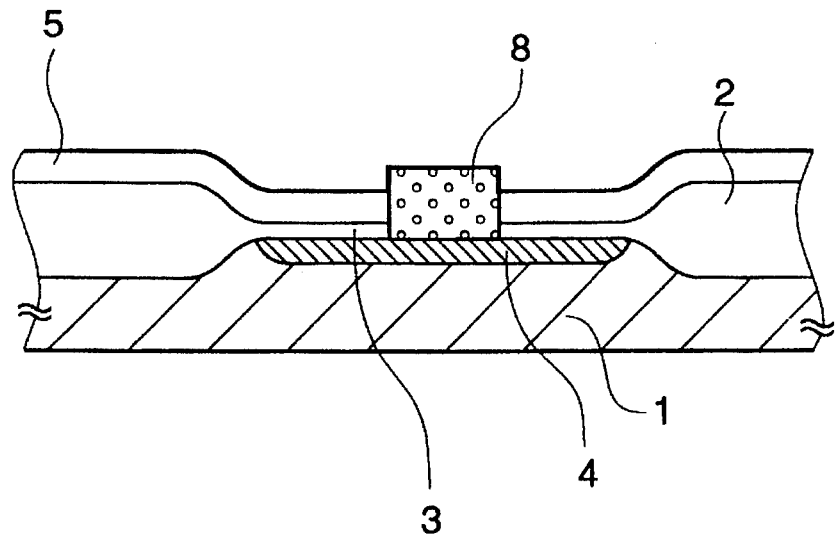
Figure 5D:
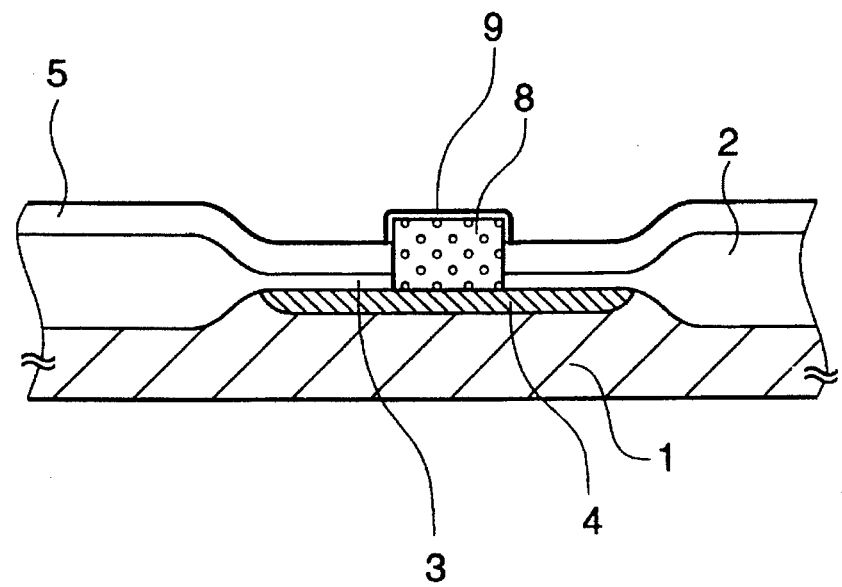

Then, as shown in FIG. 5C, the spacer layer (silicon nitride) 6 is removed by an etching. Furthermore, as shown in FIG. 5D, a surface of a portion of the polysilicon film (conductive material layer 8) projecting from the interlayer insulating film 5 is thermally oxidized to form a silicon oxide film having a thickness of about 500 Å, as a first insulating film 9.

Figure 5E:
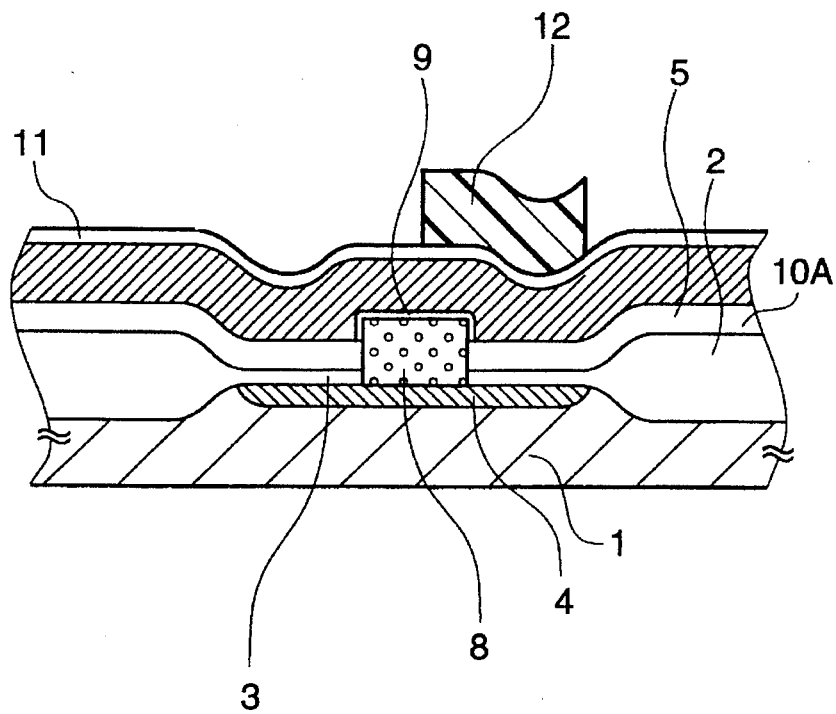

As shown in FIG. 5E, a tungsten silicide film having a thickness of about 2000 Å is deposited as a first wiring material layer 10A by a sputtering, and furthermore, a silicon nitride film having a thickness of about 1000 Å is grown as a second insulating film 11 by the CVD process. Thereafter, a photoresist mask 12 is formed on a first wiring layer forming position by a photolithography.

Figure 5F:
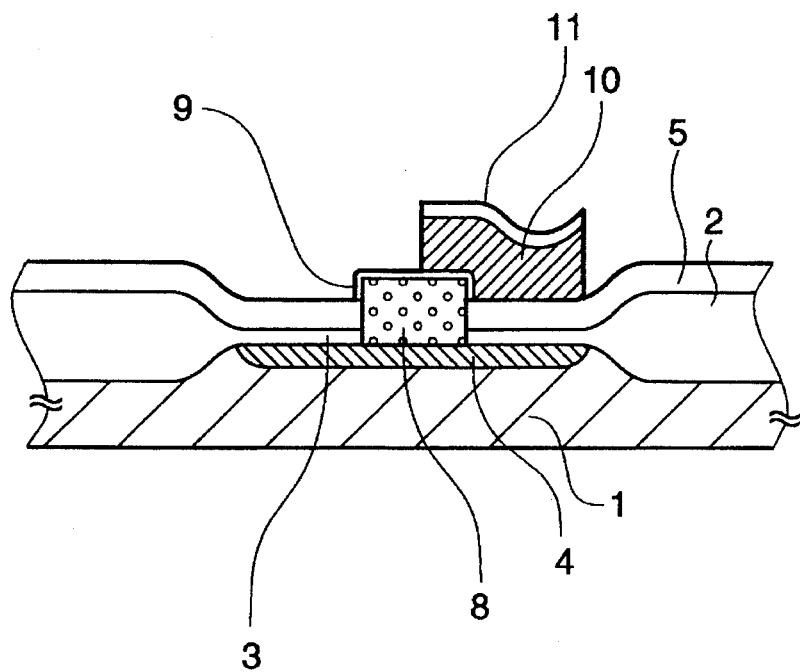

As shown in FIG. 5F, an anisotropic etching is performed to pattern the second insulating film 11 and the first wiring material layer 10A, so that a first wiring layer 10 is formed. Then, the photoresist mask 12 is removed.

Figure 5G:
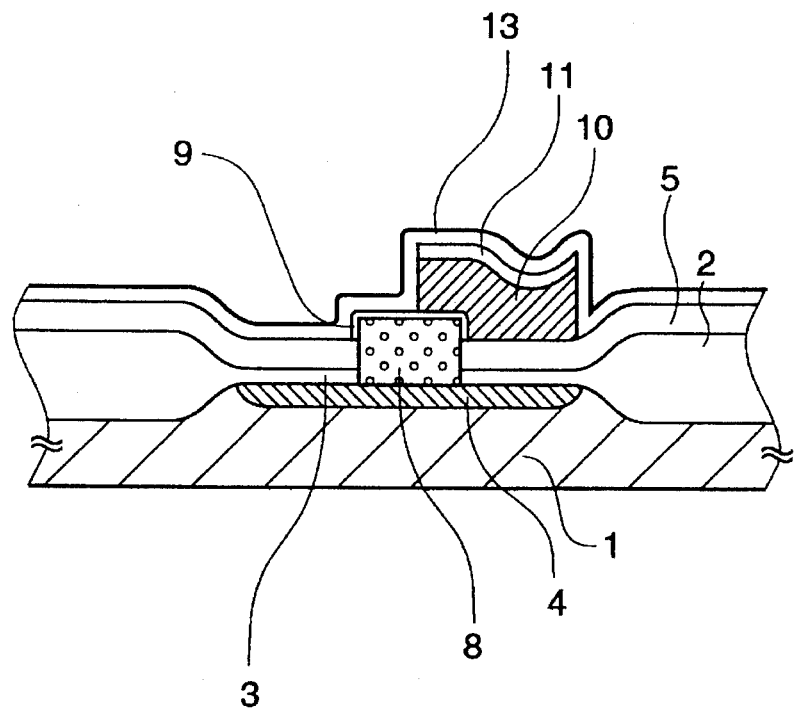
Figure 5H:
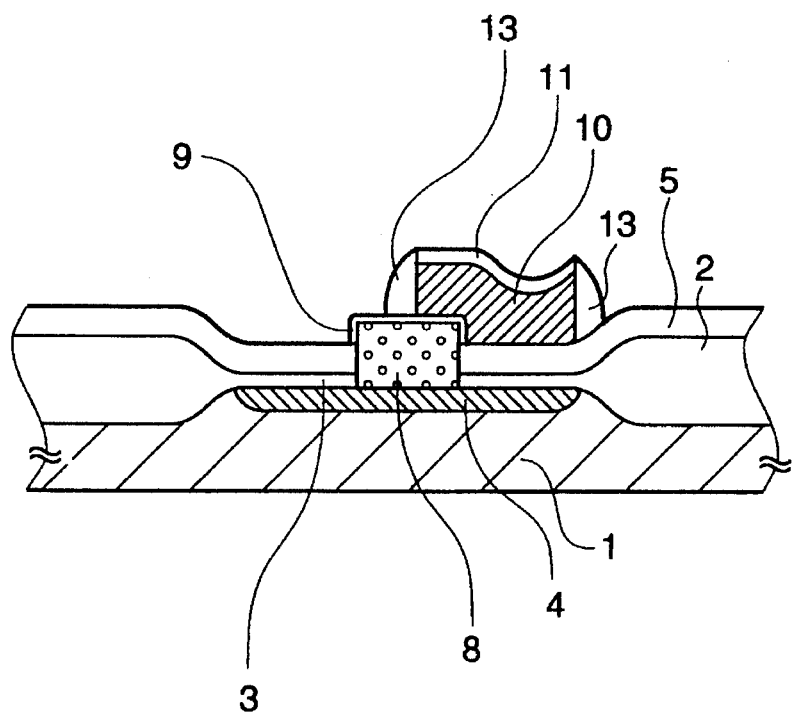

Thereafter, as shown in FIG. 5G, a silicon nitride film having a thickness of about 800 Å is grown as a third insulating film 13 by the CVD process, and thereafter, as shown in FIG. 5H, an anisotropic etching is performed for the third insulating film 13 so that the third insulating film 13 remains as a side wall on only a side surface of the first wiring layer 10.

Figure 5I:
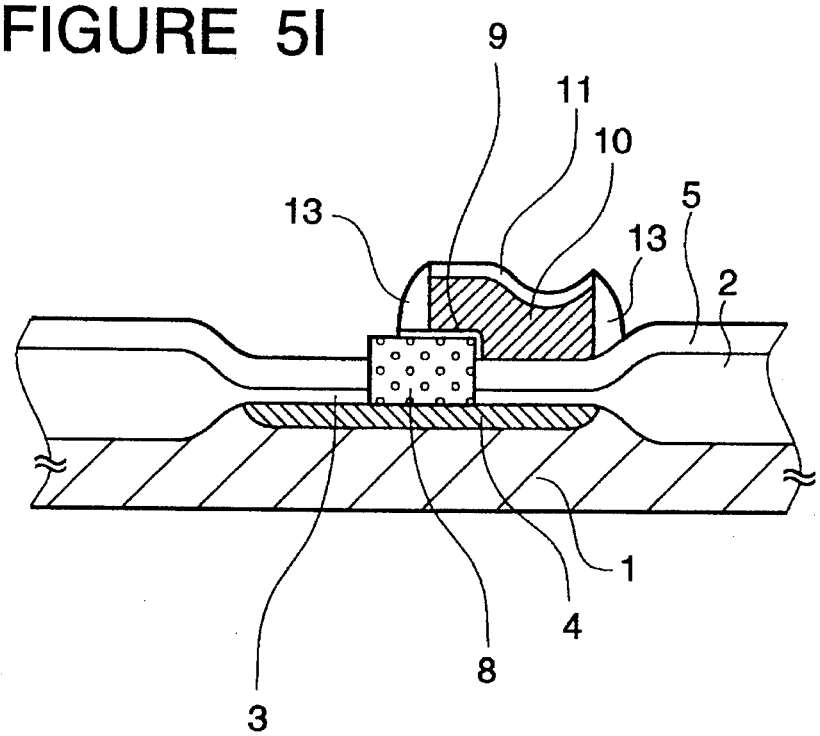

Them as shown in FIG. 5I, an exposed first insulting film 9 is removed by an isotopic etching.

Figure 5J:
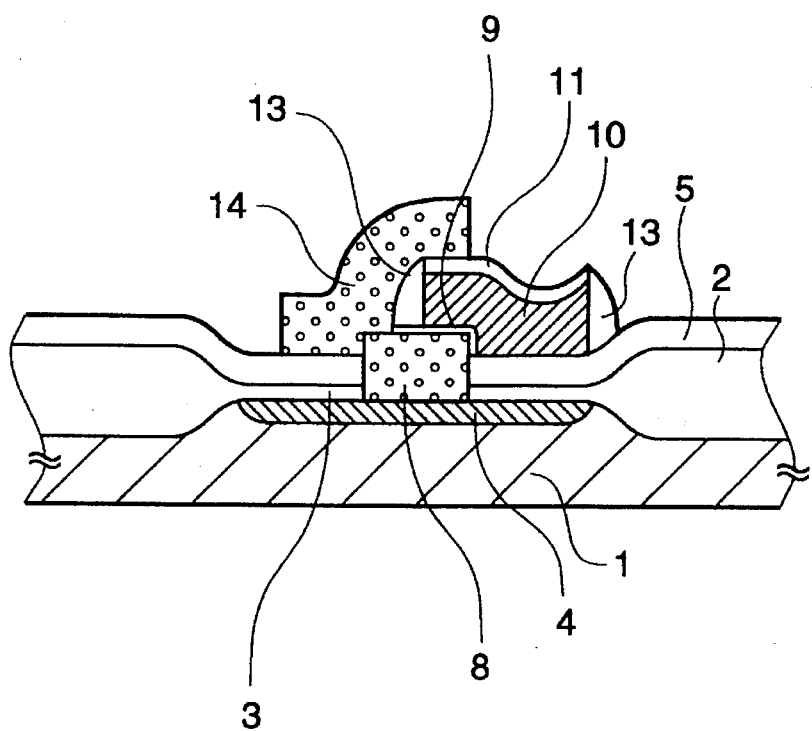

Furthermore, as shown in FIG. 5J, a polysilicon film having a thickness of about 3000 Å, is grown, and the grown polysilicon film is patterned so as to form a second wiring layer 14.

Thus, the structure shown in FIG. 4 can be obtained.

In the above mentioned embodiment, the required photoresist mask process includes only three steps, namely, the contact hole forming step, the first wiring layer patterning step and the second wiring layer patterning step. Accordingly, the number of required photoresist mask steps is the same as that required in the conventional example shown in FIG. 1.

Figure 6:
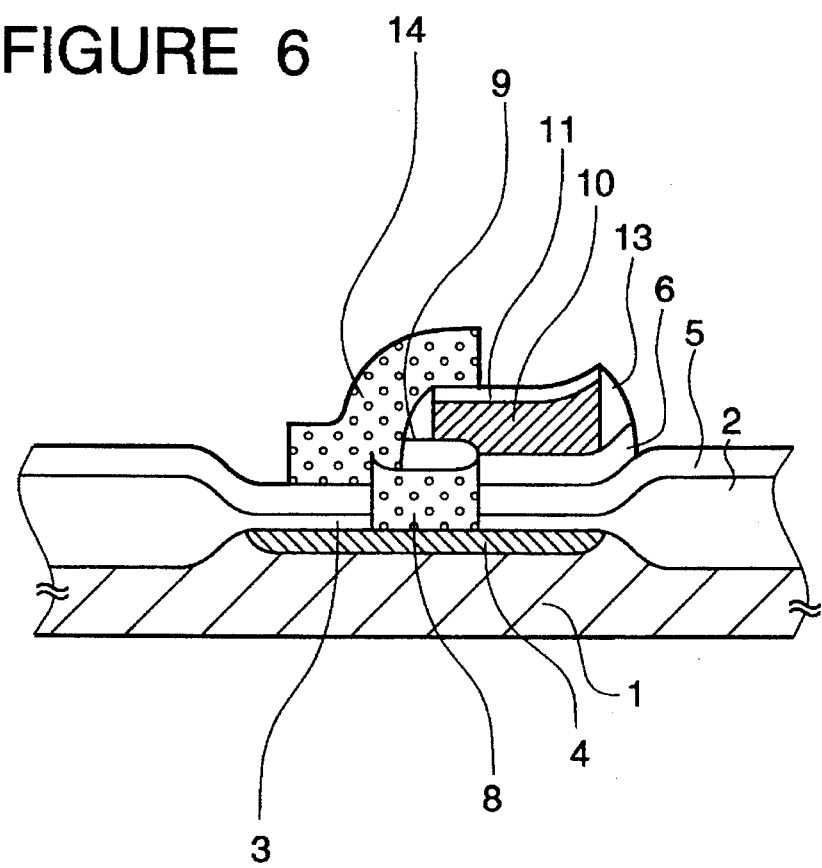
FIG. 6 is a diagrammatic sectional view illustrating a second embodiment of the wiring and contact structure in accordance with the present invention.

Now, a second embodiment of the wiring and contact structure in accordance with the present invention will be described with reference to FIG. 6. In FIG. 6, elements similar to those shown in FIG. 4 are given the same Reference Numerals, and explanation thereof will be omitted for simplification.

As seen from comparison between FIGS. 4 and 6, the second embodiment is characterized in that the spacer layer 6 is left under the first wiring layer 10, and therefore, since the first wiring layer can be formed on a planarized surface, even if the first wiring layer is thin in film thickness, it is possible to reduce possibility that the first wiring layer becomes open-circuited at a step portion.

Now, a process for forming the second embodiment of the wiring and contact structure will be described with FIGS. 7A to 7H. In FIGS. 7A to 7H, elements similar to those shown in FIGS. 5A to 5J are given the same Reference Numerals.

Firstly, a field oxide film 2 having a thickness of about 4000 Å is formed on a p-type silicon substrate 1 by means of a conventional LOCOS process, and then, a gate oxide film 3 having a thickness of about 150 Å is formed by a thermal oxidation. Furthermore, an n-type diffused layer 4 is formed by ion-implanting for example arsenic under an energy of 50 KeV and a concentration of $10 \times 10 \cdot$ cm$^{-2}$.

Figure 7A:
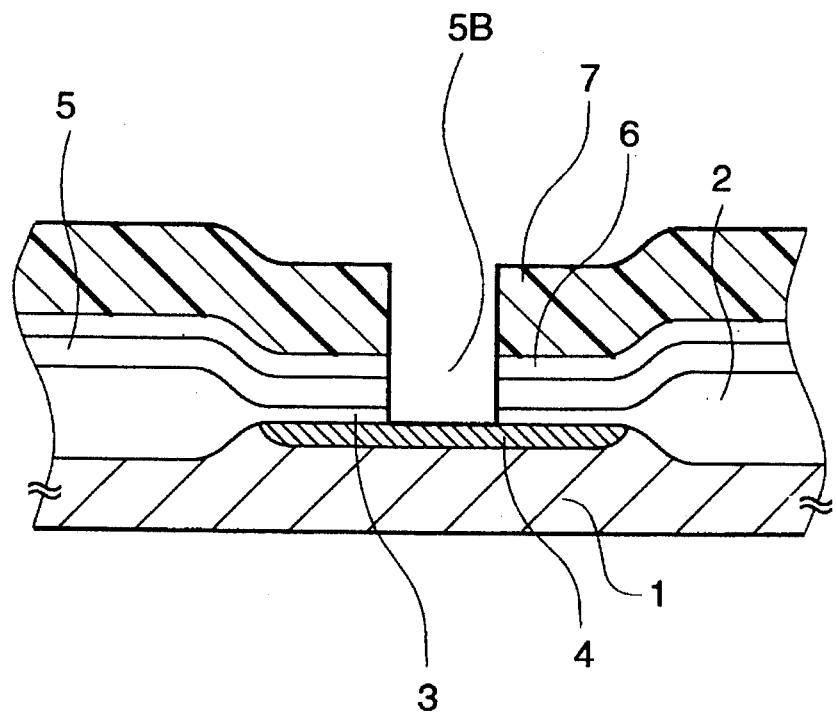
FIG. 7A to 7H are diagrammatic sectional views illustrating a process for forming the wiring and contact structure shown in FIG. 6.

Thereafter, a silicon oxide film having a thickness of about 3000 Å is deposited by for example a CVD process so as to form an interlayer insulating film 5, and then, a silicon nitride film having a thickness of about 2000 Å and having a film property different from that of the interlayer insulating film 5, is deposited by for example a CVD process so as to form a spacer layer 6. Thereafter, a photoresist 7 having a predetermined pattern is formed, and the spacer layer 6, the interlayer insulating film 5 and the gate oxide film 3 are selectively etched using the photoresist 7 as a mask, so as to form a contact hole 5B in which a surface of the n-type diffused layer 4 is exposed, as shown in FIG. 7A.

Figure 7B:
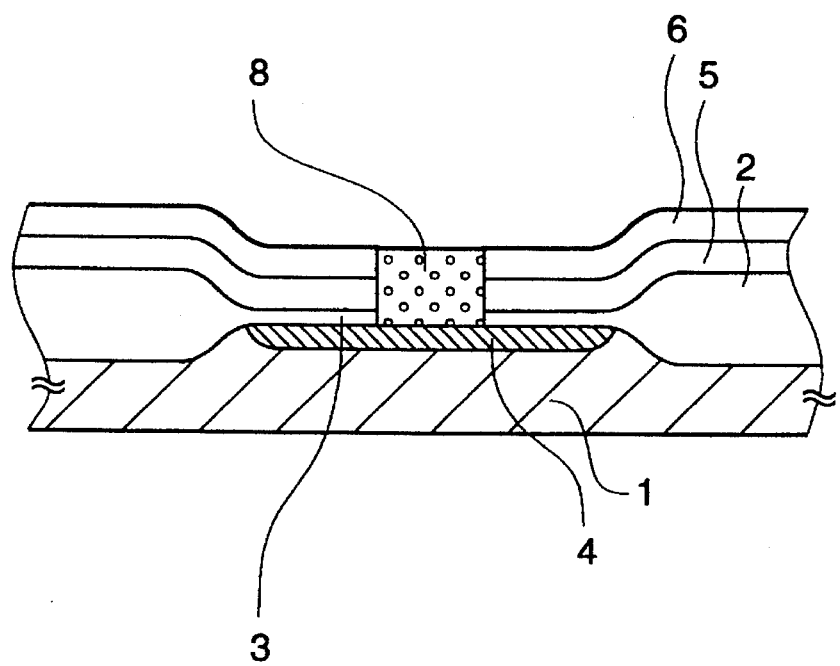

Thereafter, as shown in FIG. 7B, a polysilicon film having a thickness of about 3000 Å, is grown, and the grown polysilicon film is etched back by an anisotropic etching so as to form a conductive material layer 8 filling the contact hole 5B.

Figure 7C:
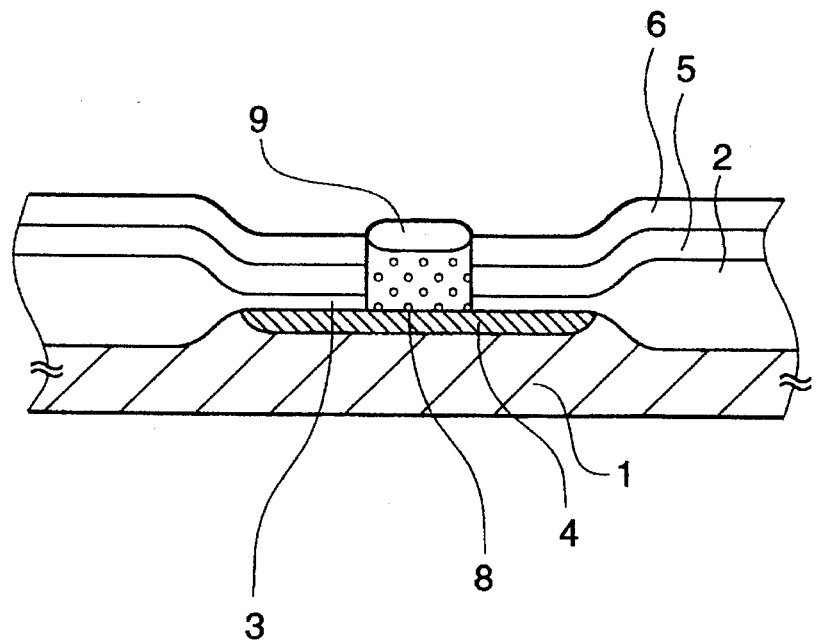

Then, as shown in FIG. 7C, a thermal oxidation is performed to form a silicon oxide film having a thickness of about 500 Å, on an exposed surface of the polysilicon film (conductive material layer 8), as a first insulating film 9.

Figure 7D:
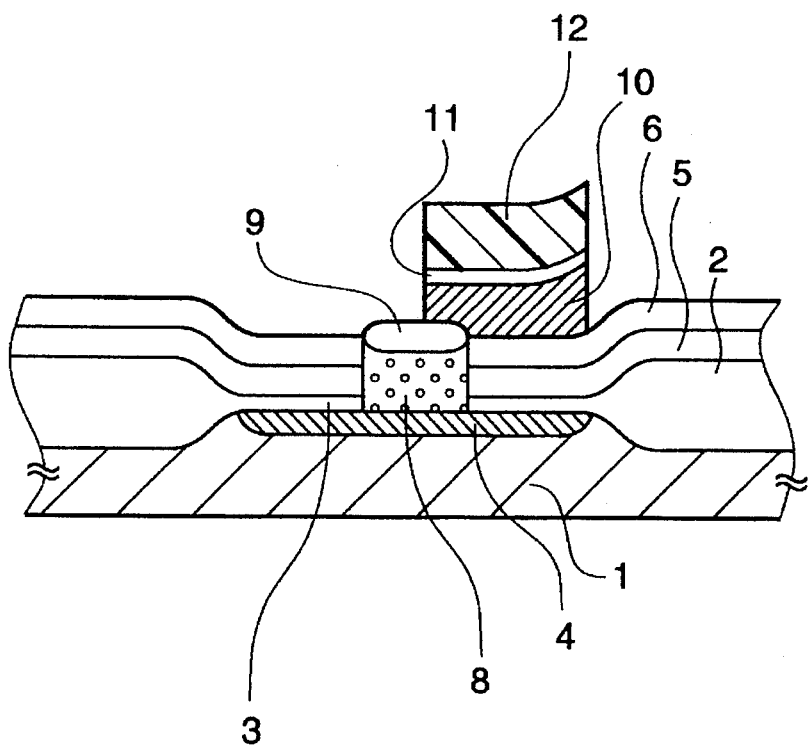

Thereafter, as shown in FIG. 7D, a tungsten silicide film having a thickness of about 2000 Å is deposited as a first wiring material layer by a sputtering, and furthermore, a silicon nitride film having a thickness of about 2000 Å is grown as a second insulating film 11 by the CVD process.

Thereafter, a photoresist mask 12 is formed on a first wiring layer forming position by a photolithography, and an anisotropic etching is performed to pattern the second insulating film 11 and the first wiring material layer, so that a first wiring layer 10 is formed. Then, the photoresist mask 12 is removed.

Figure 7E:
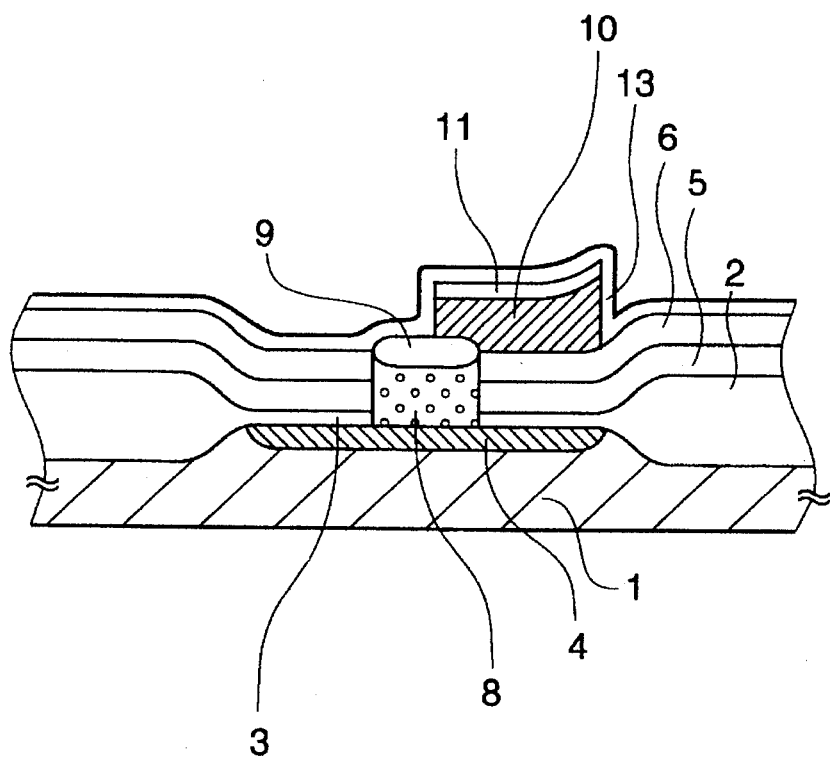
Figure 7F:
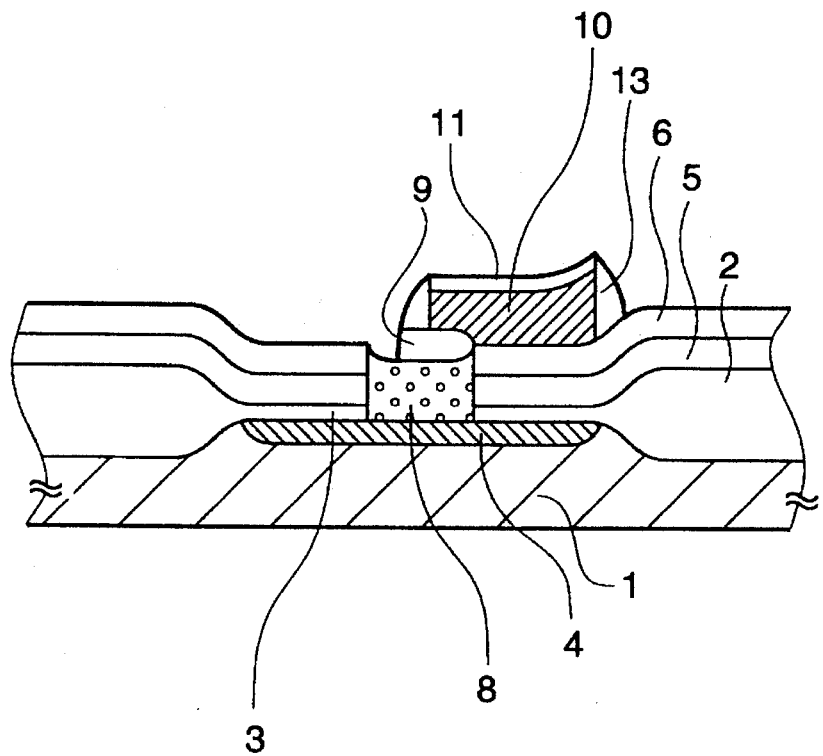

Thereafter, as shown in FIG. 7E, a silicon oxide film having a thickness of about 1000 Å is grown as a third insulating film 13 by the CVD process, and thereafter, as shown in FIG. 7F, an anisotropic etching is performed so that the third insulating film 13 and the first insulating film 9 are removed on a planar portion, and on the other hand, a portion of the third insulating film 13 remains as a side wall on only a side surface of the first wiring layer 10. In this process, the film thickness of the second insulting film 11 is considerably reduced.

Figure 7G:
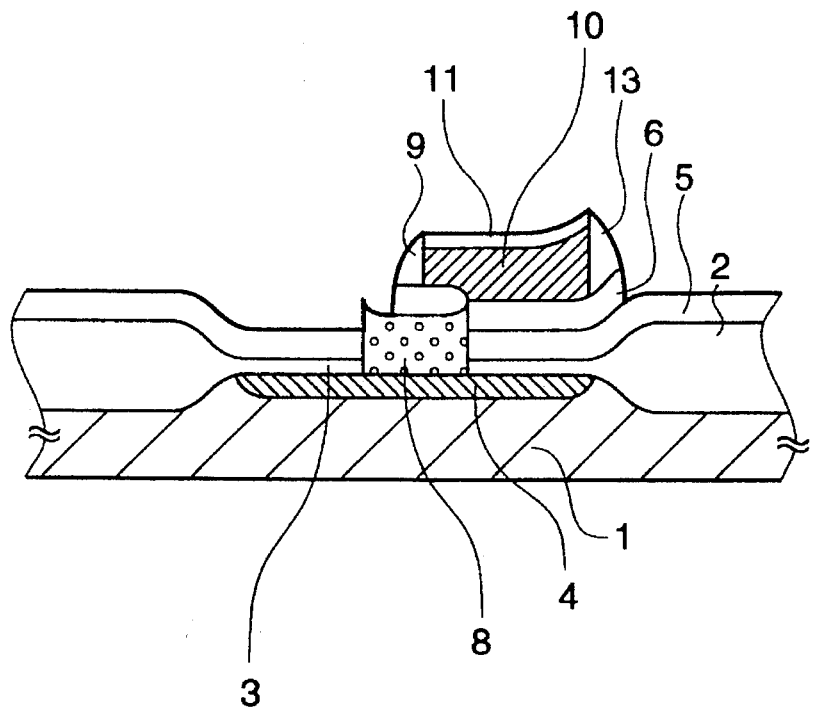
Figure 7H:
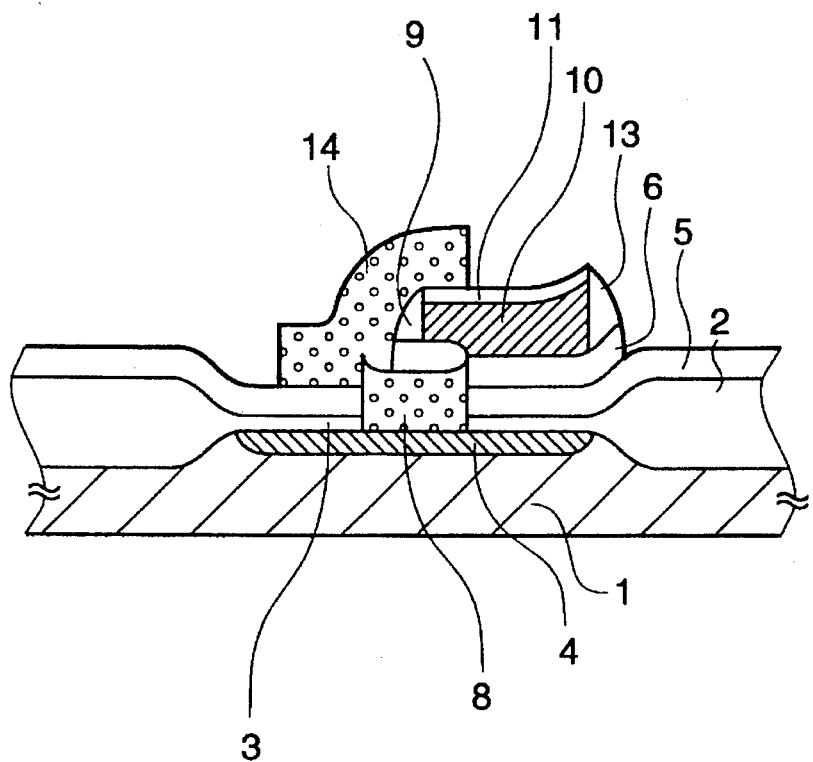

Then, as shown in FIG. 7G, an exposed spacer layer 6 is removed by etching using the first, second and third insulating films as a mask Furthermore, as shown in FIG. 7H, a polysilicon film having a thickness of about 3000 Å, is grown, and the grown polysilicon film is patterned so as to form a second wiring layer 14.

Thus, the wiring and contact structure of the second embodiment shown in FIG. 6 can be obtained.

Now, a third embodiment of the wiring and contact structure in accordance with the present invention will be described with FIGS. 8A to 8D, which are diagrammatic sectional views illustrating a process for forming a third embodiment of the wiring and contact structure in accordance, with the present invention. In FIGS. 8A to 8D, elements similar to those shown in FIGS. 5A to 5J are given the same Reference Numerals.

Figure 8A:
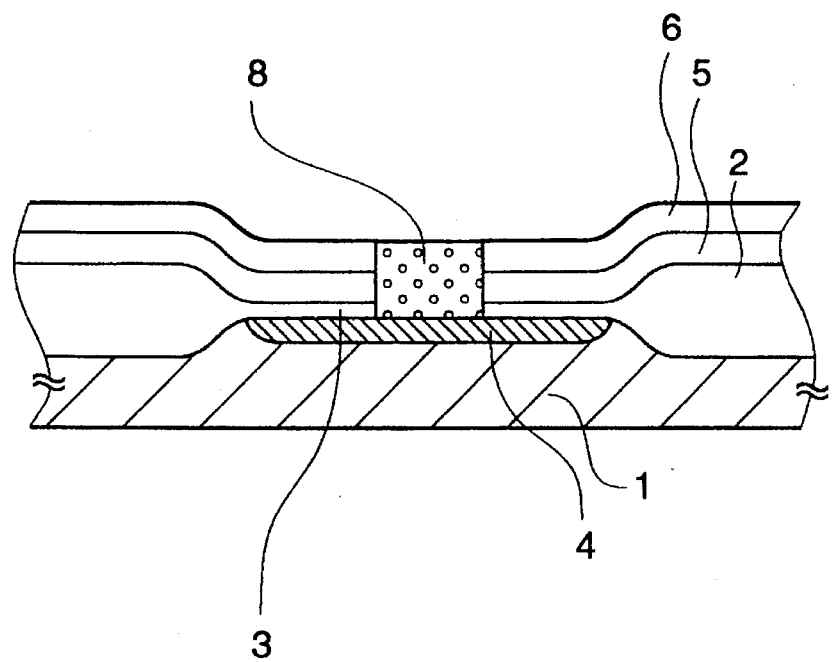
FIG. 8A to 8D are diagrammatic sectional views illustrating a process for forming a third embodiment of the wiring and contact structure in accordance with the present invention.

In this third embodiment, similarly to the first embodiment, on a p-type silicon substrate 1, a field oxide film 2 and a gate oxide film 3 are formed in the named order, and an n-type diffused layer 4 is formed in a surface of the substrate. Thereafter, an interlayer insulating film 5 composed of a silicon oxide film having a thickness of about 3000 Å, and a spacer layer 6 composed of a silicon nitride film having a thickness of about 2000 Å, are deposited in the named order. The spacer layer 6, the interlayer insulating film 5 and the gate oxide film 3 are selectively etched so as to form a contact hole in which a surface of the n-type diffused layer 4 is exposed. Thereafter, a tungsten (W) is selectively grown within the contact hole so as to form a conductive material layer 8 as shown in FIG. 8A.

Figure 8B:
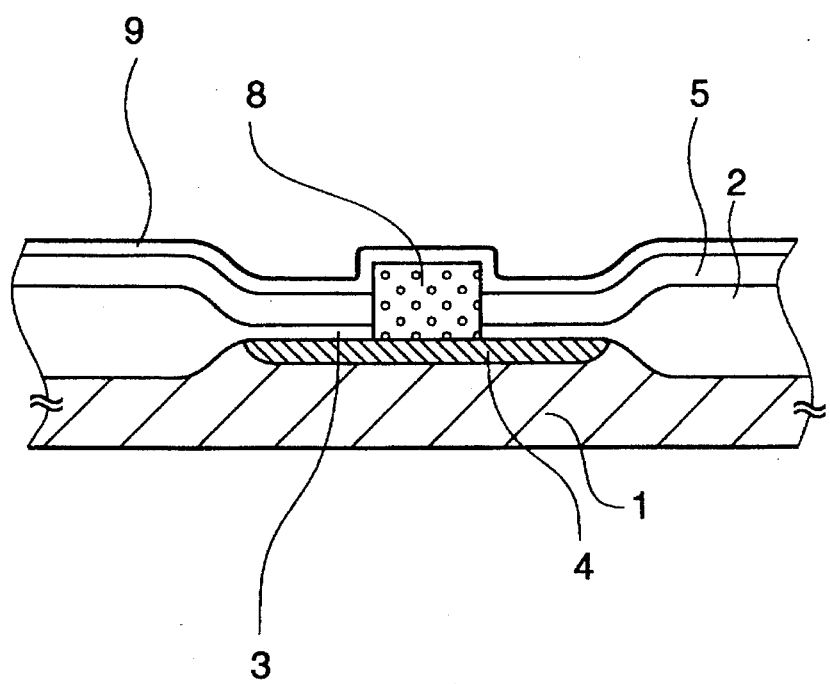

Thereafter, the spacer layer 6 is removed by an etching, and thereafter, a silicon nitride film having a thickness of about 1000 Å is grown by the CVD process so as to form a first insulating film 9, as shown in FIG. 8B.

Figure 8C:
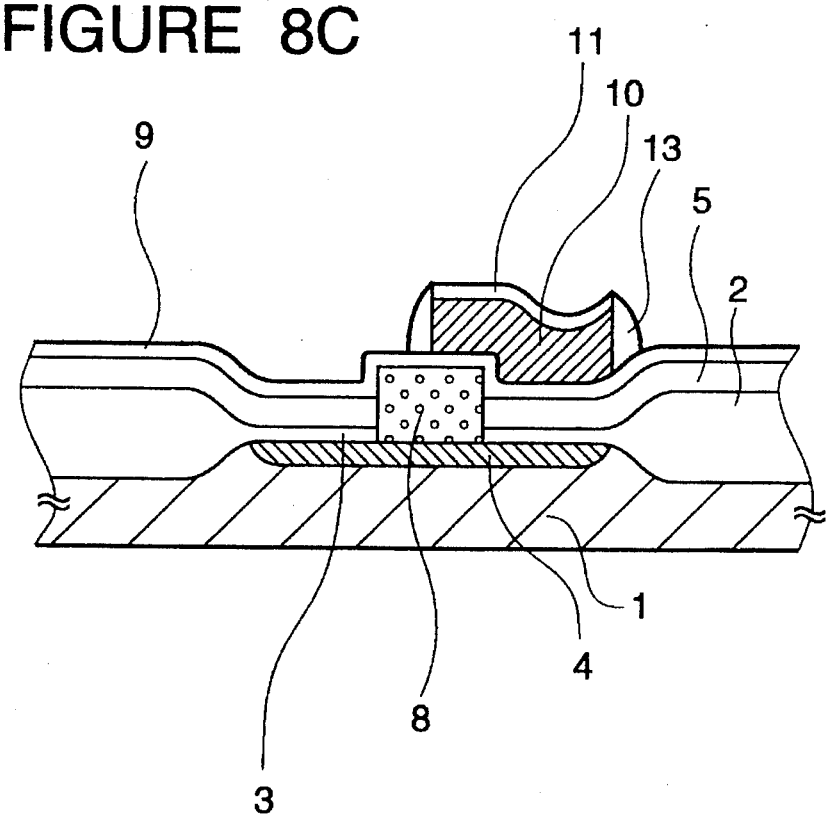

Then, a tungsten silicide film having a thickness of about 2000 Å is deposited as a first wiring material layer by a sputtering, and furthermore, a silicon oxide film having a thickness of about 1000 Å is grown as a second insulating film 11 by the CVD process. Thereafter, these deposited films are patterned by a photolithography, so that a first wiring layer 10 having the second insulating film 11 deposited thereon is formed. Thereafter, a silicon oxide film having a thickness of about 1000 Å is grown as a third insulating film 13 by the CVD process, and thereafter, an anisotropic etching is performed for the third insulating film 13 so that a portion of the third insulating film 13 remains as a side wall on only a side surface of the first wiring layer 10, as shown in FIG. 8C.

Figure 8D:
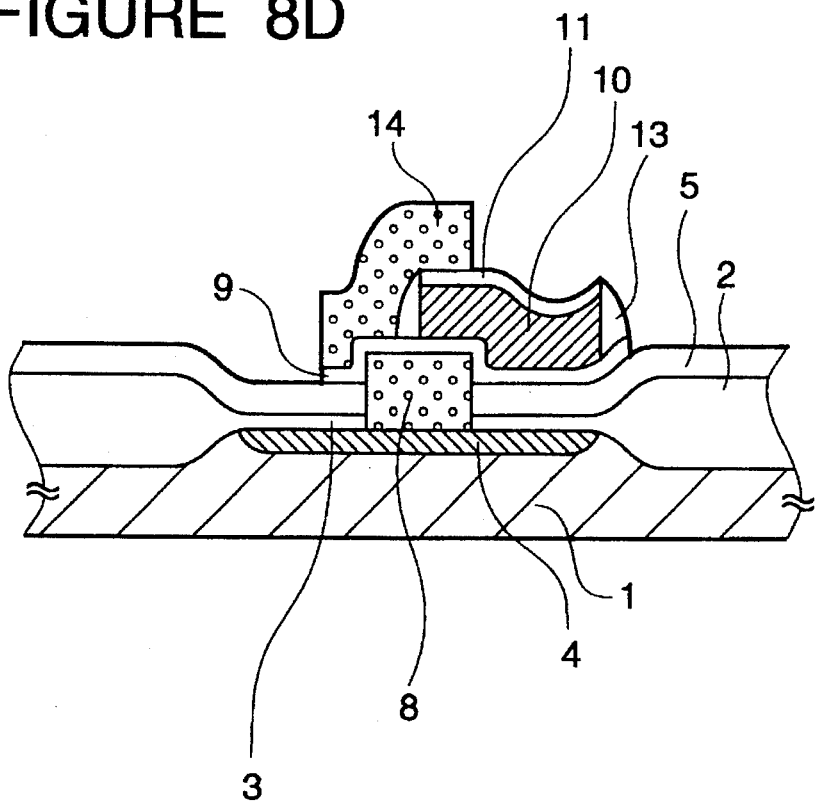

Then, as shown in FIG. 8D, an exposed first insulting film 9 is etched using the second and third insulating films as a mask, and furthermore an aluminum layer is deposited and patterned so as to form a second wiring layer 14. Thus the structure of the third embodiment is completed.

Figure 9:
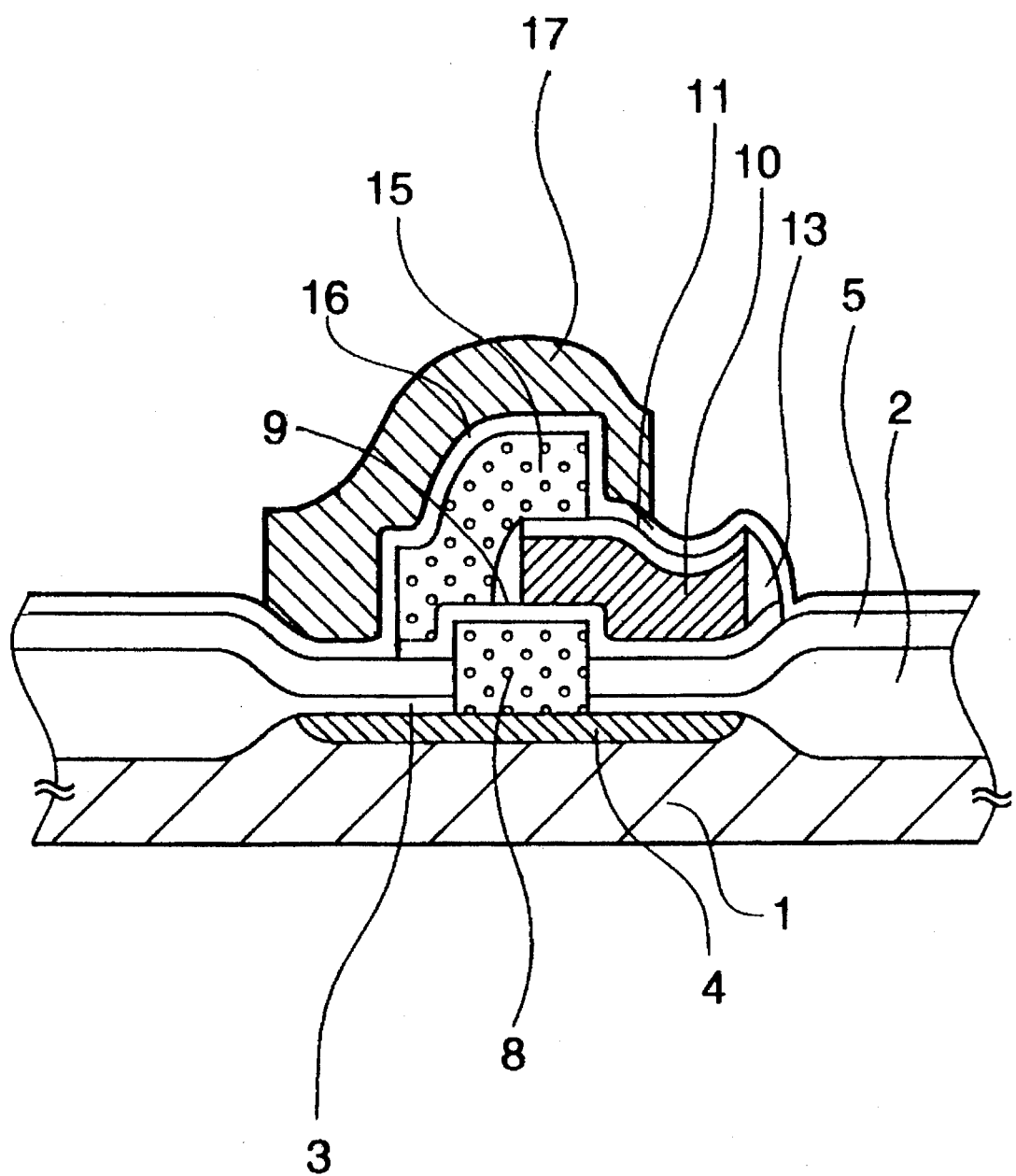
FIG. 9 is a diagrammatic sectional view illustrating a fourth embodiment of the wiring and contact structure in accordance with the present invention.

Referring to FIG. 9, there is shown a diagrammatic sectional view illustrating a fourth embodiment of the wiring and contact structure in accordance with the present invention. In FIG. 9, elements similar to those shown in FIG. 4 are given the same Reference Numerals, and explanation thereof will be omitted for simplification of description.

As seen from comparison between FIG. 4 and 9, the fourth embodiment is characterized in that a capacitor lower electrode 15 composed of polysilicon is formed in place of the second wiring layer 14, and furthermore, a capacitor dielectric film 16 is formed on the capacitor lower electrode 15 and a capacitor upper electrode 17 is formed on the capacitor dielectric film 16. Thus, a capacitor is formed. Therefore, it could be understood that the present invention can be applied to a memory cell of a DRAM (dynamic random access memory).

In the above mentioned embodiment, the contact is formed for the n-type diffused layer, but the present invention is not limited to these embodiments. In other words, the wiring and contact structure of the present invention can be equally applied to a p-type diffused layer and other wiring layer. In addition, there is no restriction in connection with what is connected with the first and second wiring layers. For example, the first and second wiring layers may be connected to other n-type diffused layers, or other wiring conductors. Furthermore, the present invention can be applied to not only a MOS type of semiconductor device but also other types of semiconductor devices.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising a semiconductor substrate, a conducting layer formed in said semiconductor substrate, an interlayer insulating layer formed above said conducting layer, a contact hole formed in said interlayer insulating layer to expose a surface of said conducting layer, a conductive material layer filled in said contact hole, said conductive material layer having a projection projecting above said surface of said interlayer insulating layer and not extending over said interlayer insulating layer, a first wiring layer formed to have a part overlapping a part of said projection of said conductive material layer, a first insulating film formed between said projection of said conductive material layer and said first wiring layer, a second insulating film formed on an upper surface of said first wiring layer and having the same pattern as that of first wiring layer, a side wall insulating film formed on a side surface of said first wiring layer, and a second wiring layer formed in contact with both top and side portions of said projection of said conductive material layer but insulated from said first wiring layer by said second insulating film and said side wall insulating film.

2. A semiconductor device claimed in claim 1 wherein said second wiring layer constitutes a capacitor lower electrode, and a capacitor dielectric film is formed on said second wiring layer and a capacitor upper electrode is formed on said capacitor dielectric film.

\* \* \* \* \*